United States Patent
Iwase et al.

(10) Patent No.: US 11,030,734 B2
(45) Date of Patent: Jun. 8, 2021

(54) MIRROR DIE IMAGE RECOGNITION SYSTEM, REFERENCE DIE SETTING SYSTEM, AND MIRROR DIE IMAGE RECOGNITION METHOD

(71) Applicant: FUJI CORPORATION, Chiryu (JP)

(72) Inventors: Tomonori Iwase, Gamagori (JP); Masahiro Morishita, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 48 days.

(21) Appl. No.: 16/471,017

(22) PCT Filed: Jan. 6, 2017

(86) PCT No.: PCT/JP2017/000279
§ 371 (c)(1),
(2) Date: Jun. 19, 2019

(87) PCT Pub. No.: WO2018/127973
PCT Pub. Date: Jul. 12, 2018

(65) Prior Publication Data
US 2019/0392574 A1 Dec. 26, 2019

(51) Int. Cl.
*G06T 7/00* (2017.01)
*G06K 9/78* (2006.01)
(Continued)

(52) U.S. Cl.
CPC .............. *G06T 7/0004* (2013.01); *G06K 9/78* (2013.01); *H01L 21/67288* (2013.01);
(Continued)

(58) Field of Classification Search
CPC ........ G06T 7/0004; G06T 2207/30148; G06K 9/78; G06K 2209/19; H01L 21/67288;
(Continued)

(56) References Cited

U.S. PATENT DOCUMENTS

| | | | | |
|---|---|---|---|---|
| 5,881,888 A | * | 3/1999 | Ohkawara | H01L 21/67271 209/552 |
| 2007/0241417 A1 | * | 10/2007 | Huibers | H01L 31/02327 257/436 |
| 2008/0188016 A1 | * | 8/2008 | Pare | G06T 7/0004 438/16 |

FOREIGN PATENT DOCUMENTS

| | | |
|---|---|---|
| JP | 11-67876 A | 3/1999 |
| JP | 2002-26041 A | 1/2002 |

OTHER PUBLICATIONS

International Search Report dated Mar. 14, 2017 in PCT/JP2017/000279 filed on Jan. 6, 2017.

(Continued)

*Primary Examiner* — Christopher M Brandt
(74) *Attorney, Agent, or Firm* — Oblon, McClelland, Maier & Neustadt, L.L.P.

(57) ABSTRACT

A mirror die image recognition system configured to perform recognition of a mirror die without damage or a pattern that is the same quadrilateral shape as a production die having a pattern, in a manner that distinguishes the mirror die without damage or pattern from a mirror die with damage and from a production die, the mirror die image recognition system including a camera configured to image at least a portion of the wafer in a field of view; and an image processing device configured to process the image captured by the camera to recognize, from among each of the dies in the image, a mirror die without damage in a manner that distinguishes the mirror die without damage from other dies.

9 Claims, 10 Drawing Sheets

(51) Int. Cl.
*H01L 21/67* (2006.01)
*H01L 21/66* (2006.01)
*H01L 23/544* (2006.01)
*H01L 21/683* (2006.01)

(52) U.S. Cl.
CPC ............ *H01L 22/12* (2013.01); *H01L 23/544* (2013.01); *G06K 2209/19* (2013.01); *G06T 2207/30148* (2013.01); *H01L 21/6836* (2013.01); *H01L 2221/68327* (2013.01); *H01L 2223/54466* (2013.01)

(58) Field of Classification Search
CPC ... H01L 22/12; H01L 23/544; H01L 21/6836; H01L 2221/68327; H01L 2223/54466; H01L 2223/54426
See application file for complete search history.

(56) References Cited

OTHER PUBLICATIONS

Extended European Search Report dated Nov. 6, 2019 in European Patent Application No. 17889981.1 citing documents AA-AB and AX-AY therein, 8 pages.
Anonymous, "3H03 Quality Control—Uniformity of CR Processing", Retrieved from the Internet: URL: https://qualitycontrolmedradsc3h03.weebly.com/uniformity-of-cr-processing, XP055619049, Mar. 6, 2015, 4 pages.
Goerner, F. L. et al. "A comparison of five standard methods for evaluating image intensity uniformity in partially parallel imaging MRI", Measuring uniformity in MRI with partially parallel imaging, Medical Physics., XP55619047A, vol. 40, No. 8, Aug. 2013, pp. 082302-1-082302-10.

\* cited by examiner

MIRROR DIE IMAGE RECOGNITION SYSTEM, REFERENCE DIE SETTING SYSTEM, AND MIRROR DIE IMAGE RECOGNITION METHOD

TECHNICAL FIELD

The present disclosure relates to a mirror die image recognition system, a reference die setting system, and a mirror die image recognition method for performing recognition, from among many dies of a wafer, of a mirror die without damage or a pattern that is the same quadrilateral shape as a production die (normal die) having a pattern, in a manner that distinguishes the mirror die without damage or pattern from a mirror die with damage and from a production die.

BACKGROUND ART

Conventionally, a camera for performing image recognition of each die of a wafer is provided in a die supply device that supplies dies (chip components) to a component mounter, however, even if image recognition is performed for each die in a wafer image captured by the camera, it is not possible to determine reliably the die position on the circular wafer of the dies recognized by the image recognition.

Thus, as disclosed in patent literature 1 (JP-A-H11-67876) and patent literature 2 (JP-A-2002-26041), a reference die formed with a pattern that allows it to be distinguished from a production die using image recognition is provided at a specified position on the wafer, image recognition of the reference die is performed first, then positions of dies to be picked up are determined using the position of the reference die as a reference position.

CITATION LIST

Patent Literature

Patent literature 1: JP-A-H11-67876
Patent literature 2: JP-A-2002-26041

BRIEF SUMMARY

Technical Problem

With a conventional reference die, because it must be formed with a pattern that allows it to be distinguished from a production die, this increases manufacturing costs of the wafer. Therefore, to reduce manufacturing costs of the wafer, it is desirable to manufacture a wafer without forming a reference die.

However, for wafers formed without a reference die, it is necessary to provide a reference position instead of the reference die, and for this one may consider using a mirror die without a pattern as a reference die.

Conventionally, dies positioned at the edge of the wafer are mirror dies without a pattern formed on them, and because the wafer is circular, mirror dies positioned at the edge of the wafer are not perfectly quadrilateral as production dies formed with patterns are, and a portion of the dies at the edge of the wafer have a damaged shape. There are many mirror dies with damage positioned at the edge of the wafer around the circumference of the wafer, so it is difficult to use such dies as a reference die.

Accordingly, when using a mirror die as a reference die, it is necessary to use a mirror die without damage, and this requires technology for performing recognition, from many dies of a wafer, of a mirror die without damage in a manner that distinguishes the mirror die without damage from a mirror die with damage and from a production die.

Solution to Problem

To solve the above problems, disclosed is a mirror die image recognition system configured to perform recognition, from many dies on a wafer diced into many separated dies, of a mirror die without damage or a pattern that is the same quadrilateral shape as a production die having a pattern, in a manner that distinguishes the mirror die without damage or pattern from a mirror die with damage and from a production die, the mirror die image recognition system including: a camera configured to image at least a portion of the wafer in a field of view; and an image processing device configured to process the image captured by the camera to recognize, from among each of the dies in the image, a mirror die without damage in a manner that distinguishes the mirror die without damage from other dies, wherein the image processing device is configured to acquire a brightness level of a region at at least five locations including regions corresponding to four corner location portions and a center portion of each die in the image, determine whether the brightness levels of the regions of the at least five locations are uniform, and recognize the die for which the brightness levels of the regions of the at least five locations are uniform as the mirror die without damage. Here, "whether the brightness levels of the regions of the at least five locations are uniform" means that the difference in the brightness levels of the regions of the at least five locations are within a specified variance range at which it is determined that they are practically uniform, considering variance in the lighting used to illuminate the dies, variance in the imaging conditions of the camera, and the like.

As for types of dies on the wafer, there are production dies with a pattern, and mirror dies without a pattern that include mirror dies without damage and mirror dies with damage; the regions of the at least five locations at which to acquire the brightness level of each of the dies are one of a region that does not include a pattern, a region that includes a pattern, and a region that includes a damaged portion of the die, and the brightness levels of these three types are different from each other. Accordingly, in a case in which the brightness level of one of the regions of the at least five locations of the die differs from the brightness level of another region, it is possible to recognize that the die is not a mirror die without damage (that is, the die is a production die or a mirror die with damage). Also, because a mirror die with damage has damage at at least one corner portion, among the regions of the four corner portions, the brightness level of the region including the damaged corner portion will differ from the brightness level of another region. Further, even if one of the corner portions of the die is damaged, a central portion of the die is not damaged. Due to this, by determining whether the brightness levels of the regions of at least five locations including regions corresponding to four corner location portions and a center portion of each die in the image are uniform, it is possible to recognize a die for which the brightness levels of the regions of the at least five locations are uniform as the mirror die without damage.

Also, recognition may be performed by dividing each die in the image into four regions with each region including one corner portion, acquiring brightness levels of the four regions, determining whether the brightness levels of the four regions are uniform, and recognizing the die for which the brightness levels of the four regions are uniform as the mirror die without damage.

In this case, it is possible to search for mirror dies without damage from among all the dies on the wafer, but the positions on the wafer at which there are mirror dies without damage are known roughly.

Thus, the image processing device may be provided with a search range specifying section configured to specify a search range within the wafer in which to search for mirror dies with damage. By specifying a search range in which to search for the mirror dies without damage, the processing time for searching for the mirror dies without damage can be reduced.

In this case, an operator may operate the search range specifying section to specify the search range, or a search range may be specified automatically based on wafer mapping data including information of whether each die of the wafer is a production die or a mirror die without damage.

Note that, if a scratch or dirt is on a region of a mirror die without damage for which the brightness level is acquired, even if the die is a mirror die without damage, there is a possibility that the brightness level of the region with the scratch or dirt will be different to the brightness region of another region, thus it is possible that the die will not be recognized as a mirror die without damage.

As a countermeasure to this, in a case in which the mirror die without damage was not recognized from the dies in the search range specified by the search range specifying section, searching may be performed again for the mirror die without damage after changing at least one of a size of the region, a position of the region, or a quantity of the regions for which the brightness level is acquired. Accordingly, in a case in which a scratch or dirt is on a region of a mirror die without damage for which the brightness level is acquired and the mirror die without damage cannot be recognized, by changing at least one of a size of the region, a position of the region, or a quantity of the regions for which the brightness level is acquired, the regions for which the brightness level is acquired can be changed to a region for which it is possible to virtually ignore the effect of the scratch or dirt, which may allow the mirror die without damage to be recognized.

Also, the image processing device may be configured to, in a case in which a quantity of the mirror dies without damage recognized in the search range specified by the search range specifying section is greater than a quantity of the mirror dies without damage that actually exist, search for the mirror dies without damage again after changing at least one of a size of the region, a position of the region, or a quantity of the regions for which the brightness level is acquired. For example, because the same pattern is formed in all of the regions of production dies for which the brightness levels are acquired, in a case in which production dies are misrecognized as a mirror die without damage, the quantity of mirror dies without damage recognized in the search range will be greater than the quantity of mirror dies without damage that actually exist. In this case, for dies recognized as mirror dies without damage, by changing at least one of a size of the region, a position of the region, or a quantity of the regions for which the brightness level is acquired, production dies misrecognized as mirror dies without damage may be correctly recognized as not being mirror dies without damage (that is, recognized as production dies, or mirror dies with damage).

DESCRIPTION OF EMBODIMENTS

Figure 1:
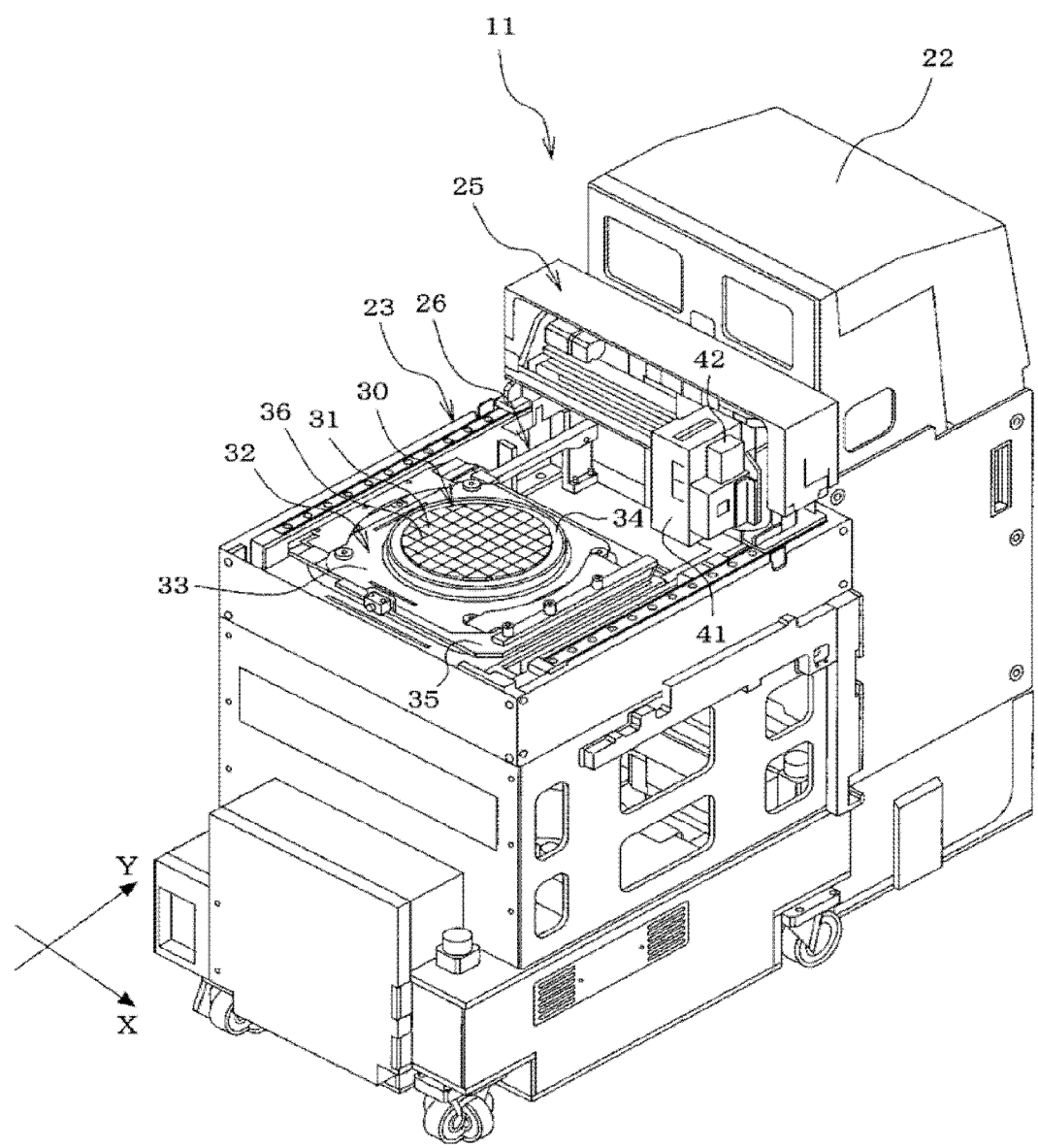
FIG. 1 is an external perspective view showing a die supply device of a first embodiment.
Figure 2:
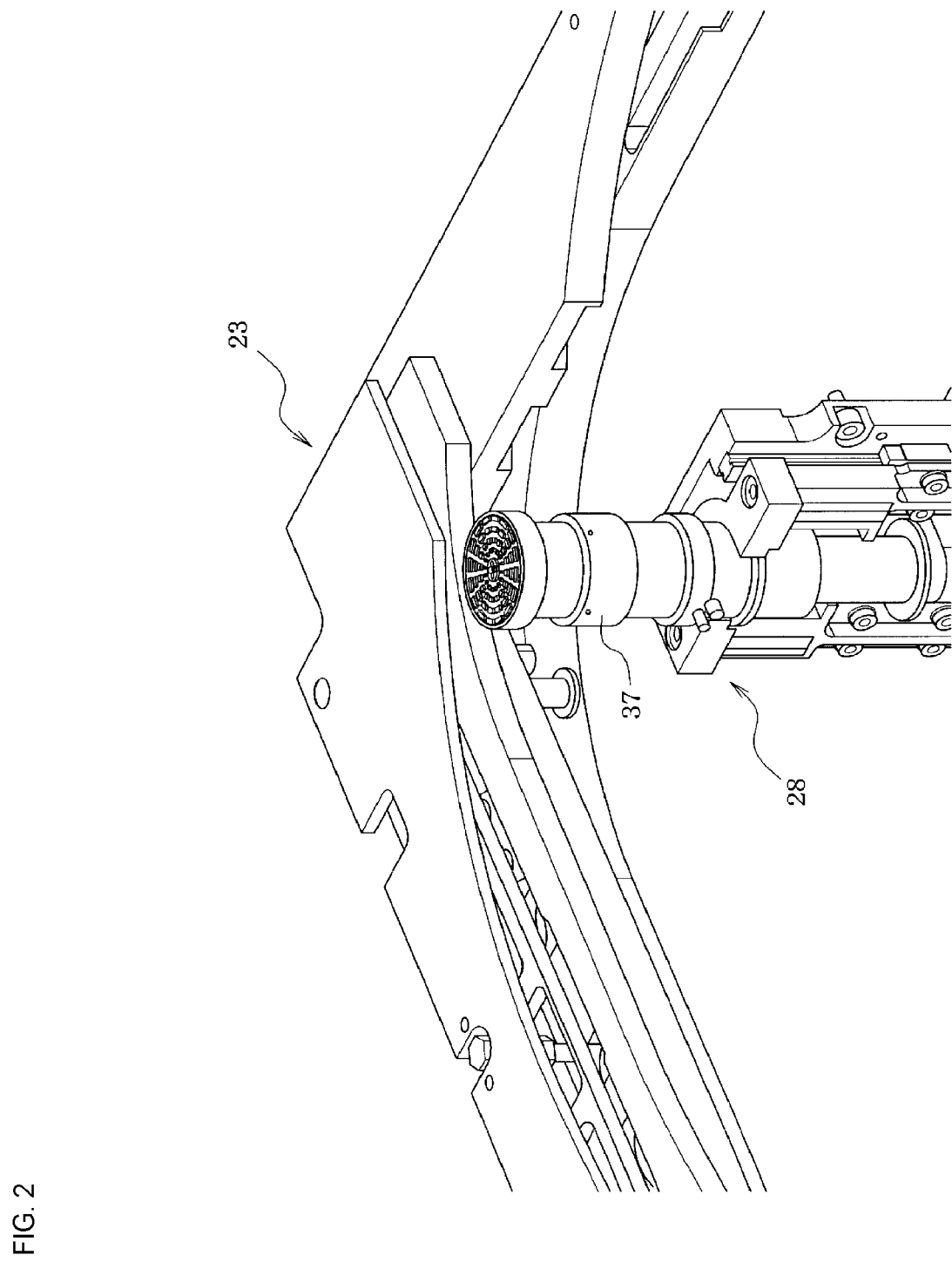
FIG. 2 is an external perspective view of a pusher unit and surrounding items.

A first and a second embodiment are described below.

First Embodiment

A first embodiment is described with reference to FIGS. 1 to 10. First, the configuration of die supply device 11 is described in summary using FIGS. 1 to 4. Die supply device 11 is provided with items including magazine holding section 22 (tray tower), pallet withdrawal table 23, XY moving mechanism 25, pallet withdrawal mechanism 26, and pusher unit 28 (refer to FIG. 2), and is set in a state with pallet withdrawal table 23 inserted into component mounter (not shown).

Figure 3:
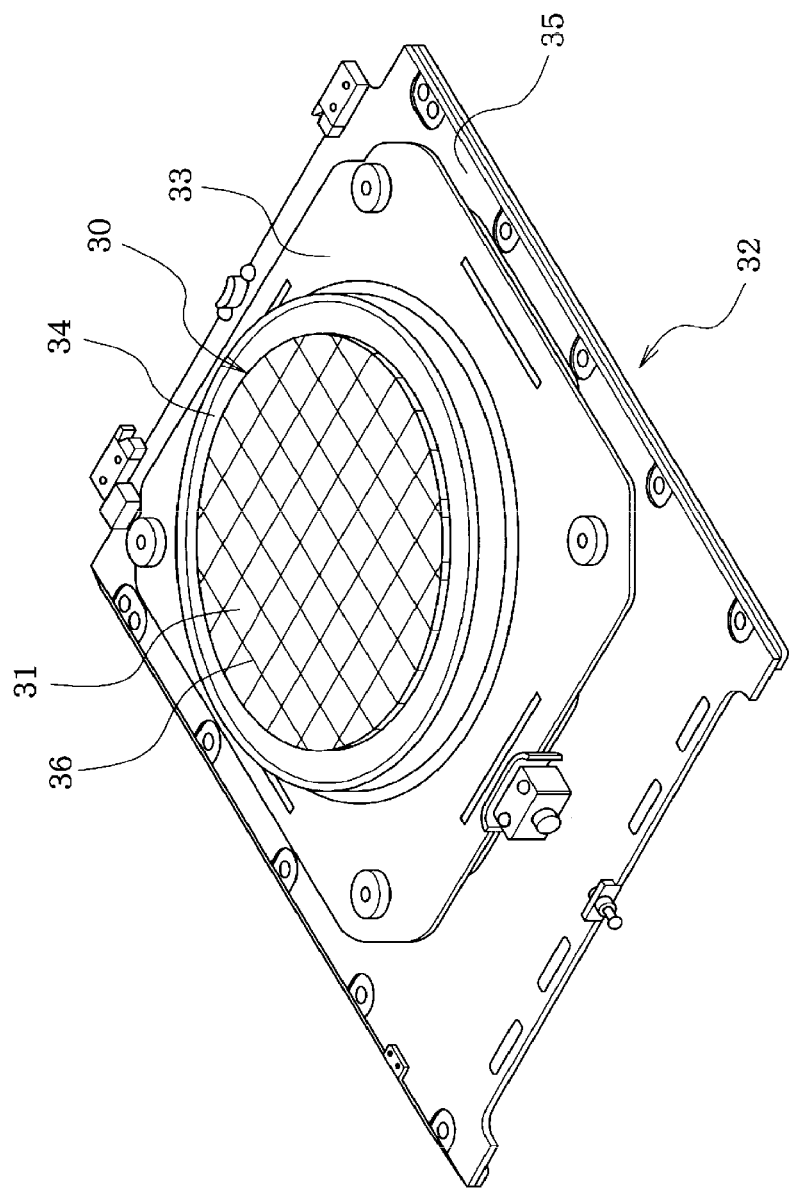
FIG. 3 is an external perspective view of a wafer pallet.
Figure 4:
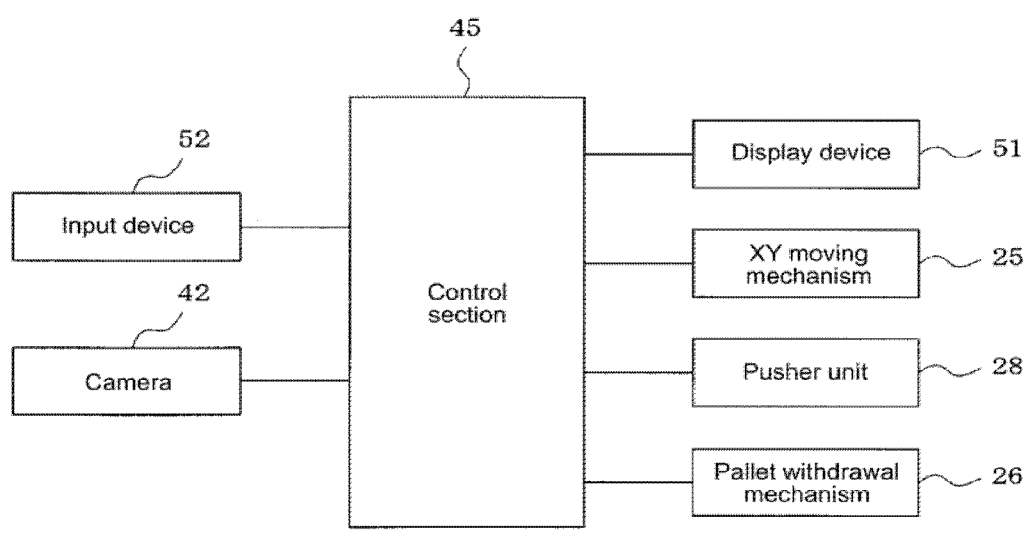
FIG. 4 is a block diagram showing the configuration of control items of the die supply device.

In the magazine (not shown) stored while capable of being moved up and down in magazine holding section 22 of die supply device 11, wafer pallets 32, set on each of which is a wafer 30, are loaded in multiple layers, such that, during production, wafer pallets 32 are withdrawn from the magazine onto pallet withdrawal table 23 and returned from pallet withdrawal table 23 to the magazine by pallet withdrawal mechanism 26. As shown in FIG. 3, wafer 30 is affixed onto elastic dicing sheet 34, and is divided into a grid of many dies 31 separated by dicing grooves 36. Dicing sheet 34 is mounted in an expanded state on dicing frame 33 that has a circular opening section, and dicing frame 33 is attached to pallet main body 35 via screws or the like.

The majority of dies 31 on wafer 30 are production dies on which a pattern is formed, but die 31 at a specified position on wafer 30 is used as a reference die, so this is a mirror die without a pattern. Mirror dies used as a reference die are provided at multiple locations on wafer 30, and mirror dies without damage, which have the same quadrilateral shape as a production die, are used as reference dies.

Dies 31 positioned at the edge of wafer 30 are mirror dies without a pattern formed on them, and, as shown in FIG. 3, because the wafer 30 is circular, mirror dies positioned at the edge of the wafer 30 are not perfectly quadrilateral as production dies are, and a portion of the dies at the edge of the wafer 30 have a damaged shape.

Pusher unit 28 (refer to FIG. 2) is configured to be capable of being moved in XY directions (horizontal front-rear and left-right directions) in the space below dicing sheet 34 of wafer pallet 32. Further, by locally pushing up the adhesive section of die 31 on dicing sheet 34 for which pickup (picking up by suction) is being attempted from below with a pusher pin (not shown) of pusher pot 37, the adhesive section of the die 31 is partially separated from dicing sheet 34 and is raised up so die 31 is in a state in which pickup is easy.

As shown in FIG. 1, the configuration is such that pickup head 41 and camera 42 that images at least a portion of wafer 30 in its field on view are assembled on XY moving mechanism 25, with pickup head 41 and camera 42 being moved together in the XY direction by XY moving mechanism 25. A suction nozzle (not shown) for picking up die 31 on dicing sheet 34 is provided on pickup head 41 such that it can be moved up and down. Camera 42 images dies 31 on dicing sheet 34 from above, and by processing the captured image it is possible to recognize the position of dies 31 within the field of view of camera 42, but, it is not possible to reliably determine at which position on the circular wafer 30 a recognized die 31 is.

Thus, in the first embodiment, among the many dies 31 on wafer 30, a mirror die without damage is provided as a reference die, and first, this mirror die without damage is recognized using a method described later, then the position of production dies that are picked up subsequently is determined based on the position of the mirror die without damage as a reference position.

Control section 45 (refer to FIG. 4) of die supply device 11 is configured mainly from a computer, performs control of operation of XY moving mechanism 25, pusher unit 28, pallet withdrawal mechanism 26, and the like, and is connected to display device 51 that displays an image of wafer 30 (refer to FIGS. 6 and 7) captured by camera 42, and input device 52 operated by an operator such as a keyboard, mouse, or touchscreen panel.

Further, control section 45 of die supply device 11 also functions as an image processing device, and using a method described later, first, among the many dies 31 on wafer 30, performs image recognition of a mirror die without damage, estimates the position of a production die that is to be picked up using the position of the recognized mirror die without damage as a reference position, uses camera 42 to capture an image of the production die using the estimated position of the production die as a target imaging die position, processes the image to recognize the position of the production die, and uses the suction nozzle of pickup head 41 to pick up the production die using suction. Further, the position of the next production die to be picked up is estimated based on the recognized position of the production die that was just picked up, camera 42 captures an image of the next production die using the estimated position of the next production die as a target imaging die position, the image is processed to recognize the position of the next production die, and the suction nozzle of pickup head 41 is used to pick up the next production die using suction, with these operations being repeated to pick up dies 31 on dicing sheet 34 in a specified order.

As described above, because there is a mixture of production dies with a pattern, and mirror dies without a pattern that include mirror dies without damage and mirror dies with damage among dies 31 on wafer 30, when using a mirror die as a reference die, it is necessary to recognize the mirror die without damage from the many dies 31 on wafer 30 in a manner that distinguishes the mirror die without damage from a mirror die with damage and from a production die.

Thus, with the first embodiment, control device 45 of die supply device 11 acquires a brightness level of a region at at least five locations including regions corresponding to four corner location portions and a center portion of each die 31 in the image, determines whether the brightness levels of the regions of the at least five locations are uniform, and recognizes the die 31 for which the brightness levels of the regions of the at least five locations are uniform as a mirror die without damage.

Figure 5:
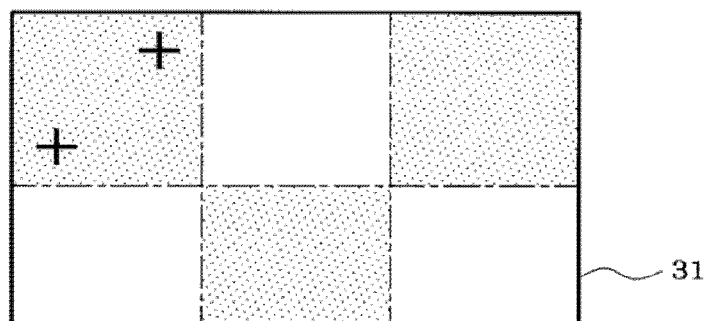
FIG. 5 illustrates regions of five locations for which the brightness level is acquired from an image of the dies.
Figure 5:
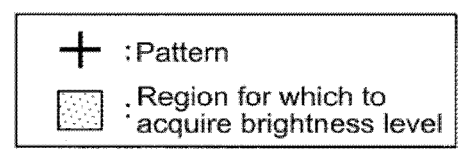

Specifically, as shown in FIG. 5, control device 45 of die supply device 11 divides each die 31 on which image recognition is performed into a grid of nine, and acquires a brightness level of a region at at least five locations including regions corresponding to four corner location portions, that is, top left, top right, bottom left, bottom right, and a center portion of each die 31 in the image, compares the brightness level of the regions of these five locations, determines whether the brightness levels of the regions of the five locations are uniform, and recognizes the die 31 for which the brightness levels of the regions of the five locations are uniform as a mirror die without damage. Here, "whether the brightness levels of the regions of the five locations are uniform" means that the difference in the brightness levels of the regions of the five locations are within a specified variance range at which it is determined that they are practically uniform, considering variance in the lighting used to illuminate the dies 31, variance in the imaging conditions of camera 42, and the like.

Figure 6:
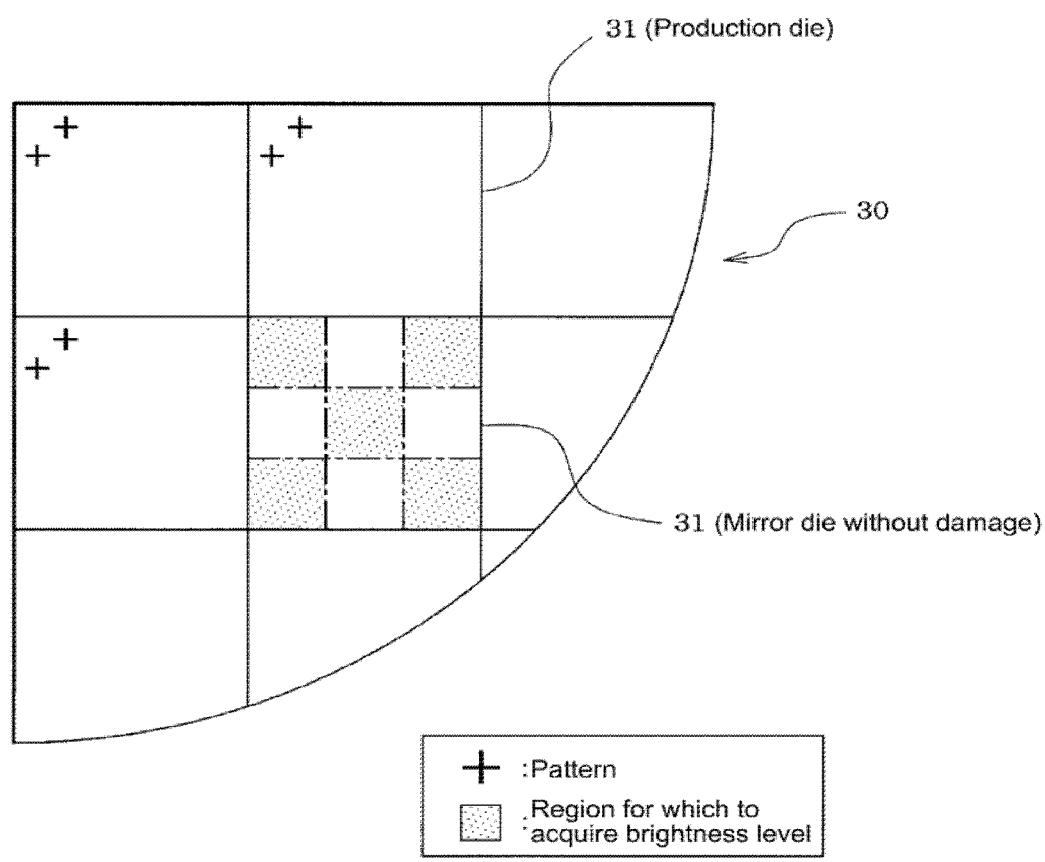
FIG. 6 shows an example of an image captured of a portion of the wafer including a mirror die without damage.
Figure 7:
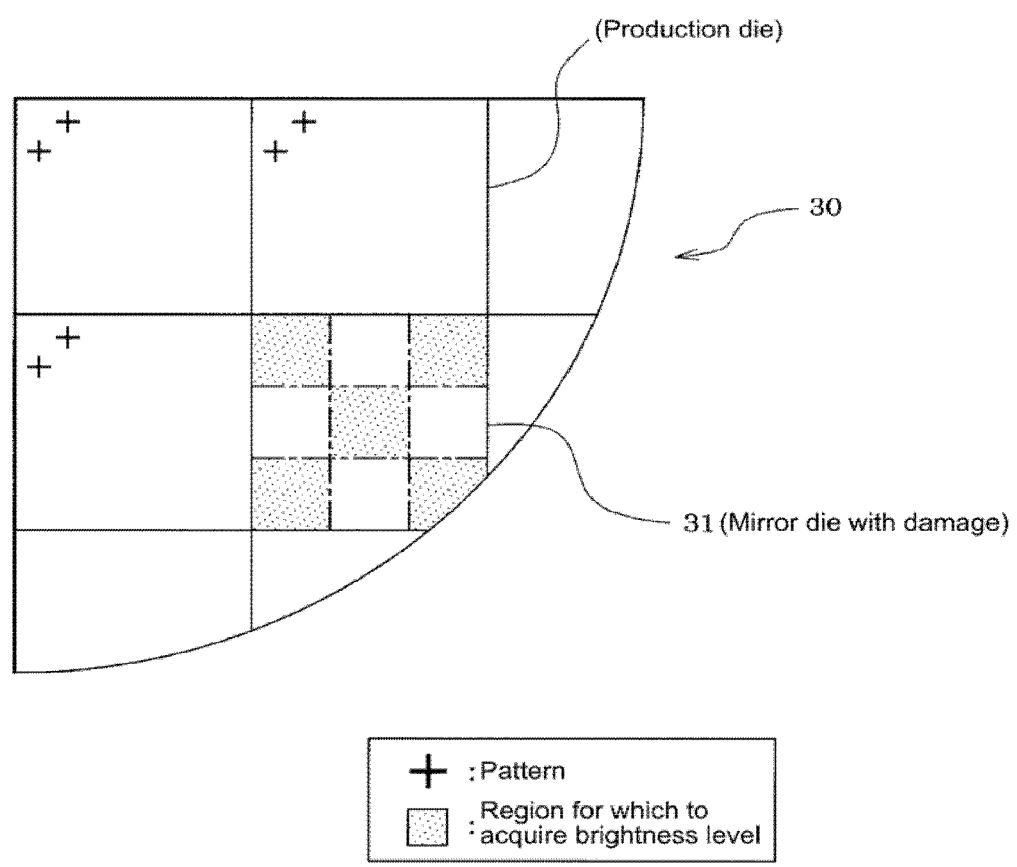
FIG. 7 shows an example of an image captured of a portion of the wafer including a mirror die with damage.

As shown in FIGS. 5 to 7, as for types of dies 31 on wafer 30, there are production dies with a pattern, and mirror dies without a pattern that include mirror dies without damage and mirror dies with damage; the regions of the five locations at which to acquire the brightness level of each of the dies 31 are one of a region that does not include a pattern, a region that includes a pattern, and a region that includes a damaged portion of the die 31, and the brightness levels of these three types are different from each other. Accordingly, in a case in which the brightness level of one of the regions of the five locations of the die differs from the brightness level of another region, that the die is not a mirror die without damage (that is, the die is a production die or a mirror die with damage) is recognized.

For example, die 31 shown in FIG. 5 has a pattern formed in a region in the top left, and the brightness level of the region in the top left is different to the brightness levels of other regions, so it is recognized that the die is not a mirror die without damage.

Die 31 at the bottom right of wafer 30 shown in the example in FIG. 6 has no damage and does not have a pattern formed in any of the regions at the five locations, therefore the brightness levels of the regions at the five locations are determined to be uniform, and the die is recognized as a mirror die without damage.

Die 31 in the bottom right of wafer shown in the example of FIG. 7 has damage at a bottom right corner portion, therefore the brightness level of the bottom right region is different to the brightness level of other regions, so it is recognized that the die is not a mirror die without damage.

In this manner, because a mirror die with damage has damage at at least one corner portion, among the regions of the four corner portions, the brightness level of the region including the damaged corner portion will differ from the brightness level of another region. Further, even if one of the corner portions of the die 31 is damaged, a central portion of the die 31 is not damaged. Due to this, as in the first embodiment, by determining whether the brightness levels of the regions of five locations including regions corresponding to four corner location portions and a center portion of each die 31 in the image are uniform, it is possible to recognize a die 31 for which the brightness levels of the regions of the at least five locations are uniform as a mirror die without damage.

In this case, it is possible to search for mirror dies without damage from among all the dies 31 on wafer 30, but because there is a large quantity of dies 31 on wafer 30, when searching for mirror dies without damage from among all the dies 31 on wafer 30, the processing time for searching the mirror dies without damage is long. Also, the positions on wafer 30 at which there are mirror dies without damage are known roughly.

Thus, in the first embodiment, control section 45 of die supply device 11 is provided with a function (search range specifying section) for specifying the search range for searching for the mirror die without damage on wafer 30. By specifying a search range in which to search for the mirror dies without damage, the processing time for searching for the mirror dies with damage can be reduced.

In this case, an operator may operate input device 52 (search range specifying section) to specify the search range while looking at an image of wafer 30 displayed on display device 51, or control device 45 of die supply device 11 may specify a search range automatically. For example, in a case in which information of mirror dies without damage is included in wafer mapping data that includes the type of each die 31 on wafer 30 (such as whether the die is good or bad), control device 45 of die supply device 11 may specify a search range automatically based on the wafer mapping data.

Figure 8:
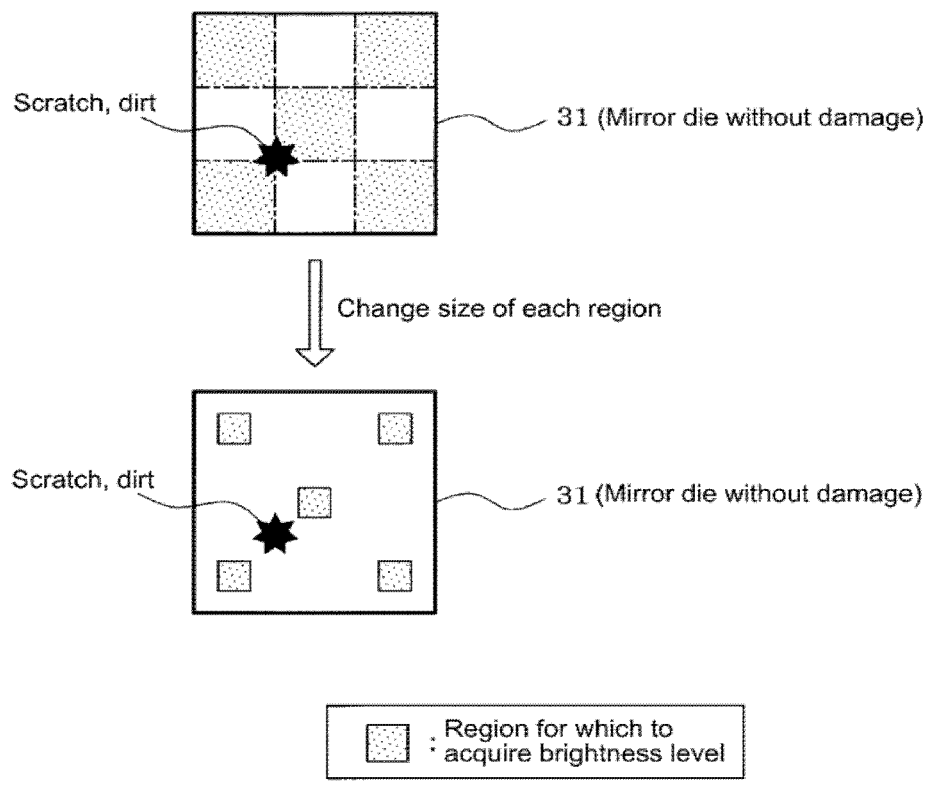
FIG. 8 illustrates an example in a case in which searching is performed again for the mirror die without damage after changing the size of the regions for which the brightness is acquired.

Note that, as shown in FIG. 8, if a scratch or dirt is on a region of a mirror die without damage for which the brightness level is acquired, even if the die is a mirror die without damage, there is a possibility that the brightness level of the region with the scratch or dirt will be different to the brightness region of another region, thus it is possible that the die will not be recognized as a mirror die without damage.

Thus, in the first embodiment, control device 45 of die supply device 11, in a case in which the mirror die without damage was not recognized from the dies in the specified search range, may perform searching again for the mirror die without damage after changing at least one of a size of the region, a position of the region, or a quantity of the regions for which the brightness level is acquired. As shown in the example in FIG. 8, by reducing the size of the regions for which to acquire the brightness levels, the regions for which to acquire the brightness levels are changed such that the effect of a scratch or dirt can be virtually ignored, and the mirror die without damage can be recognized.

Figure 9:
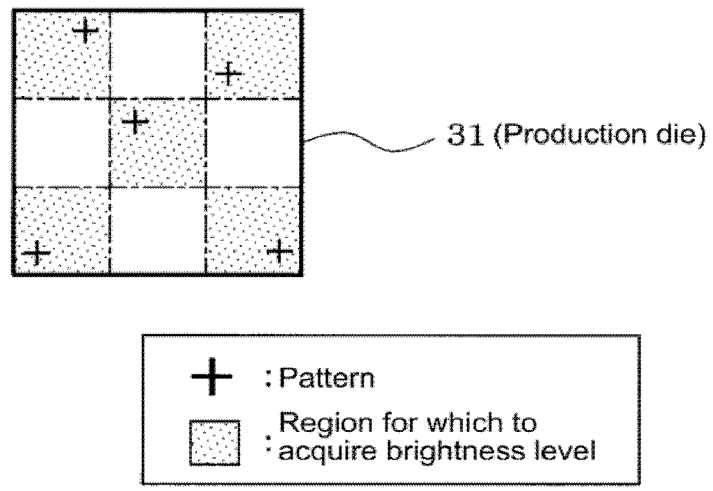
FIG. 9 illustrates a first example of a case in which a production die is misrecognized as a mirror die without damage.

Also, as shown in FIG. 9, for a production die too, if a similar pattern is formed in all of the regions of the five locations for which to acquire the brightness levels, because the brightness levels of the regions of the five locations are uniform, a production die may be misrecognized as a mirror die without damage.

Figure 10:
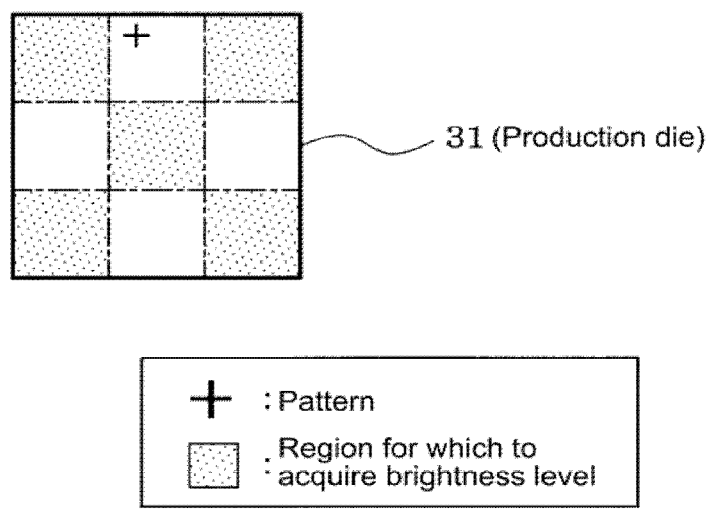
FIG. 10 illustrates a second example of a case in which a production die is misrecognized as a mirror die without damage.

Further, as shown in FIG. 10, for a production die too, if a pattern is formed only in regions for which the brightness levels are not acquired, even in a case in which no pattern is formed in the regions of the five locations for which the brightness levels are acquired, because the brightness levels of the regions of the five locations are uniform, a production die may be misrecognized as a mirror die without damage.

In the examples of FIGS. 9 and 10, if a production die is misrecognized as a mirror die without damage, the quantity of recognized mirror dies without damage will be larger than the quantity of mirror dies without damage that actually exist.

Thus, with the first embodiment, control device 45 of die supply device 11 is configured to, in a case in which a quantity of the mirror dies without damage recognized in the search range specified by the search range specifying section is greater than a quantity of the mirror dies without damage that actually exist, for dies recognized as mirror dies without damage, search for the mirror dies without damage again after changing at least one of a size of the region, a position of the region, or a quantity of the regions for which the brightness level is acquired. Accordingly, even in a case in which production dies are misrecognized as mirror dies without damage, by changing at least one of a size of the region, a position of the region, or a quantity of the regions for which the brightness level is acquired, production dies misrecognized as mirror dies without damage may be correctly recognized as not being mirror dies without damage (that is, recognized as production dies, or mirror dies with damage).

In the first embodiment described above, brightness levels of regions at five locations including regions corresponding to four corner location portions and a center portion of each die 31 in the image of wafer 30 are acquired, it is determined whether the brightness levels of the regions of the five locations are uniform, and the dies 31 for which the brightness levels of the regions of the five locations are uniform are recognized as mirror dies without damage, thus it is possible to recognize mirror dies without damage from among the many dies 31 on wafer 30. Therefore, it is possible to use mirror dies without damage as a reference die, and to determine the position of a die 31 to be picked up subsequently using the position of the mirror die without damage as a reference.

Note that, in the first embodiment, brightness levels of regions at five locations including regions corresponding to four corner location portions and a center portion of each die 31 are acquired, but the brightness levels for other regions may be acquired in addition to these five, such as brightness levels may be acquired for regions of at least six locations.

Second Embodiment

Figure 11:
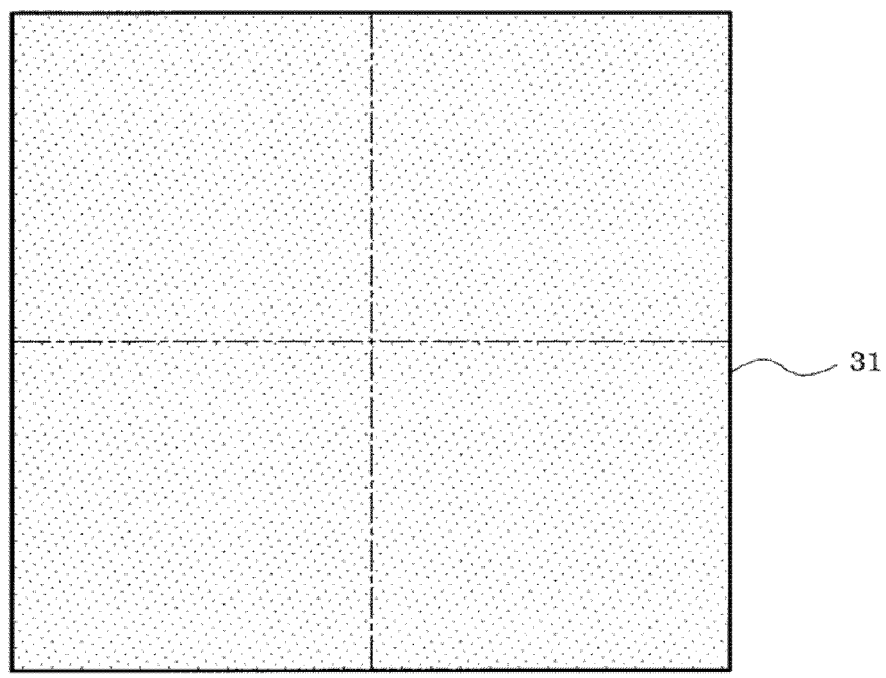
FIG. 11 illustrates regions of four locations for which the brightness level is acquired from an image of the die in a second embodiment.

Next, a second embodiment is described using FIG. 11. However, for portions which are effectively the same as in the first embodiment, the same symbols will be assigned and description will be omitted or simplified, and description will mainly be given of different portions.

In the first embodiment, brightness levels of regions at at least five locations including regions corresponding to four corner location portions and a center portion of each die 31 are acquired, but in the second embodiment, as shown in FIG. 11, recognition is performed by dividing each die in the image into four regions with each region including one corner portion, acquiring brightness levels of the four regions, determining whether the brightness levels of the four regions are uniform, and recognizing the die for which the brightness levels of the four regions are uniform as the mirror die without damage. In this manner too, similar effects to the first embodiment are achieved.

In addition, it goes without saying that the present disclosure is not limited to the first and second embodiments described above, and various embodiments with changes that do not extend beyond the scope of the disclosure are possible, such as those with appropriate changes to the configuration of die supply device 11 or the configuration of wafer pallet 32.

REFERENCE SIGNS LIST

11: die supply device;
30: wafer;
31: die;
32: wafer pallet;
34: dicing sheet;
37: pusher pot;
41: pickup head;
42: camera;
45: control section (image processing device, search range specifying section);
52: input device (search range specifying section)

The invention claimed is:

1. A mirror die image recognition system configured to perform recognition, from many dies on a water diced into many separated dies, of a mirror die having a same quadrilateral shape as a production die having a pattern, in a manner that distinguishes the mirror die from the production die, the mirror die image recognition system comprising:
   a camera configured to image at least a portion of the wafer in a field of view; and
   processing circuitry configured to
      process the image to acquire a brightness level of a region at least five locations including regions corresponding to four corner location portions and a center portion of each die in an image captured by the camera,
      determine whether the brightness levels of the regions of the at least five locations are uniform, and
      recognize the die for which the brightness levels of the regions of the at least five locations are uniform as the mirror die having the same quadrilateral shape as the production die from other dies in the image.

2. The mirror die image recognition system according to claim 1, wherein
   the processing circuitry is configured to divide each die in the image into four regions with each region including one corner portion, acquire brightness levels of the four regions, determine whether the brightness levels of the four regions are uniform, and recognize the die for which the brightness levels of the four regions are uniform as the mirror die having the same quadrilateral shape as the production die.

3. The mirror die image recognition system according to claim 1, wherein
   the processing circuitry is configured to specify a search range within the wafer in which to search for mirror dies.

4. The mirror die image recognition system according to claim 3, wherein
   the processing circuitry is configured to specify the search range based on wafer mapping data including information of whether each die of the wafer is the production die or the mirror die having the same quadrilateral shape as the production die.

5. The mirror die image recognition system according to claim 3, wherein
   the image circuitry is configured to, in a case in which the mirror die having the same quadrilateral shape as the production die was not recognized from the dies in the search range specified by the search range specifying section, search for the mirror die having the same quadrilateral shape as the production die again after changing at least one of a size of the region, a position of the region, or a quantity of the regions for which the brightness level is acquired.

6. The mirror die image recognition system according to claim 3, wherein
   the image circuitry is configured to, in a case in which a quantity of the mirror dies having the same quadrilateral shape as the production die recognized in the search range specified by the search range specifying section is greater than a quantity of the mirror dies having the same quadrilateral shape as the production die that actually exist, search for the mirror dies having the same quadrilateral shape as the production die again after changing at least one of a size of the region, a position of the region, or a quantity of the regions for which the brightness level is acquired.

7. A reference die setting system configured to set, as a reference die used as a reference position for determining a position of each production die, the mirror die having the same quadrilateral shape as the production die recognized by the mirror die image recognition system according to claim 1.

8. A mirror die image recognition method for performing recognition, from many dies on a wafer diced into many separated dies, of a mirror die having a same quadrilateral shape as a production die having a pattern, in a manner that distinguishes the mirror die from the production die, the mirror die image recognition method comprising:
   imaging at least a portion of the wafer in a field of view of a camera; and
   processing the image captured by the camera by acquiring a brightness level of a region at least five locations including regions corresponding to four corner location portions and a center portion of each die in the image, determining whether the brightness levels of the regions of the at least five locations are uniform, and recognizing the die for which the brightness levels of the regions of the at least five locations are uniform as the mirror die having the same quadrilateral shape as the production die.

9. The mirror die image recognition method according to claim 8, further comprising:
   processing the image captured by the camera by dividing each die in the image into four regions with each region including one corner portion, acquiring brightness levels of the four regions, determining whether the brightness levels of the four regions are uniform, and recognizing the die for which the brightness levels of the four regions are uniform as the mirror die having the same quadrilateral shape as the production die.

* * * * *